(12) United States Patent
Chou et al.

(10) Patent No.: US 7,863,164 B2
(45) Date of Patent: Jan. 4, 2011

(54) METHOD OF GROWING GAN USING CVD AND HVPE

(75) Inventors: Mitch M. C. Chou, Chiayi (TW); Wen-Ching Hsu, Hsinchu (TW)

(73) Assignees: Natioal Sun Yat-Sen University, Kaohsiung (TW); Sino American Silicon Products Inc., Hsinchu (TW)

( * ) Notice: Subject to any disclaimer, the term of this patent is extended or adjusted under 35 U.S.C. 154(b) by 0 days.

(21) Appl. No.: 11/808,931

(22) Filed: Jun. 13, 2007

(65) Prior Publication Data

US 2010/0248461 A1 Sep. 30, 2010

(30) Foreign Application Priority Data

Mar. 22, 2007 (TW) .................... 096110014

(51) Int. Cl.
*H01L 21/20* (2006.01)
*H01L 21/36* (2006.01)
*H01L 31/20* (2006.01)

(52) U.S. Cl. ............... 438/483; 438/479; 257/E21.085; 257/E21.086

(58) Field of Classification Search ................. 438/478, 438/479, 483; 257/E21.085, E21.086
See application file for complete search history.

(56) References Cited

U.S. PATENT DOCUMENTS

| 7,723,216 B2 * | 5/2010 | Chakraborty et al. ....... 438/483 |
| 2008/0017100 A1 * | 1/2008 | Chyi et al. .................. 117/104 |

* cited by examiner

*Primary Examiner*—Alexander G Ghyka
*Assistant Examiner*—Seahvosh J Nikmanesh
(74) *Attorney, Agent, or Firm*—Jackson IPG PLLC; Demian K. Jackson

(57) ABSTRACT

A thick gallium nitride (GaN) film is formed on a $LiAlO_2$ substrate through two stages. First, GaN nanorods are formed on the $LiAlO_2$ substrate through chemical vapor deposition (CVD). Then the thick GaN film is formed through hydride vapor phase epitaxy (HVPE) by using the GaN nanorods as nucleus sites. In this way, a quantum confined stark effect (QCSE) becomes small and a problem of spreading lithium element into gaps in GaN on using the $LiAlO_2$ substrate is mended.

5 Claims, 4 Drawing Sheets

METHOD OF GROWING GAN USING CVD AND HVPE

FIELD OF THE INVENTION

The present invention relates to growing GaN; more particularly, relates to growing a thick GaN film on a GaN nucleus sites through a chemical vapor deposition (CVD) and a hydride vapor phase epitaxy (HVPE).

DESCRIPTION OF THE RELATED ART

An environment for growing GaN through CVD and HVPE usually uses a lot of ammonia ($NH_3$) gas and hydrogen chloride (HCL) gas. And the HCl gas usually etches more surface than the $NH_3$ gas.

However, the growing procedure is complex and the GaN obtained is too thin. If GaN is grown directly under HVPE by using a $LiAlO_2$ substrate under a high temperature, a possible problem is that the lithium element in the substrate may be spread on a surface of the substrate before GaN nucleus sites are formed and thus a pollution may occur.

Consequently, the GaN obtained through the prior art may have HCl accumulated and lithium element spread into GaN structure, not to mention that the GaN obtained is too thin. Hence, the prior art does not fulfill all users' requests on actual use.

SUMMARY OF THE INVENTION

The main purpose of the present invention is to grow GaN nanostructure through a CVD and growing a thick GaN film through a HVPE on the GaN nanostructure as nucleus sites.

Another purpose of the present invention is to effectively mend a problem of spreading lithium element into gaps in GaN while using a $LiAlO_2$ substrate.

To achieve the above purposes, the present invention is a method of growing GaN using CVD and HVPE, comprising steps of: (a) obtaining a $LiAlO_2$ substrate and a two-stage reactor device; (b) obtaining GaN nanorods through CVD in the reactor device under a high temperature; and (c) obtaining a thick GaN film through HVPE in the reactor device with the GaN nanorods as nucleus sites. Accordingly, a novel method of growing GaN using CVD and HVPE is obtained.

BRIEF DESCRIPTIONS OF THE DRAWINGS

The present invention will be better understood from the following detailed description of the preferred embodiment according to the present invention, taken in conjunction with the accompanying drawings, in which FIG. 1 is the flow view showing the preferred embodiment according to the present invention;

DESCRIPTION OF THE PREFERRED EMBODIMENT

The following description of the preferred embodiment is provided to understand the features and the structures of the present invention.

Figure 1:
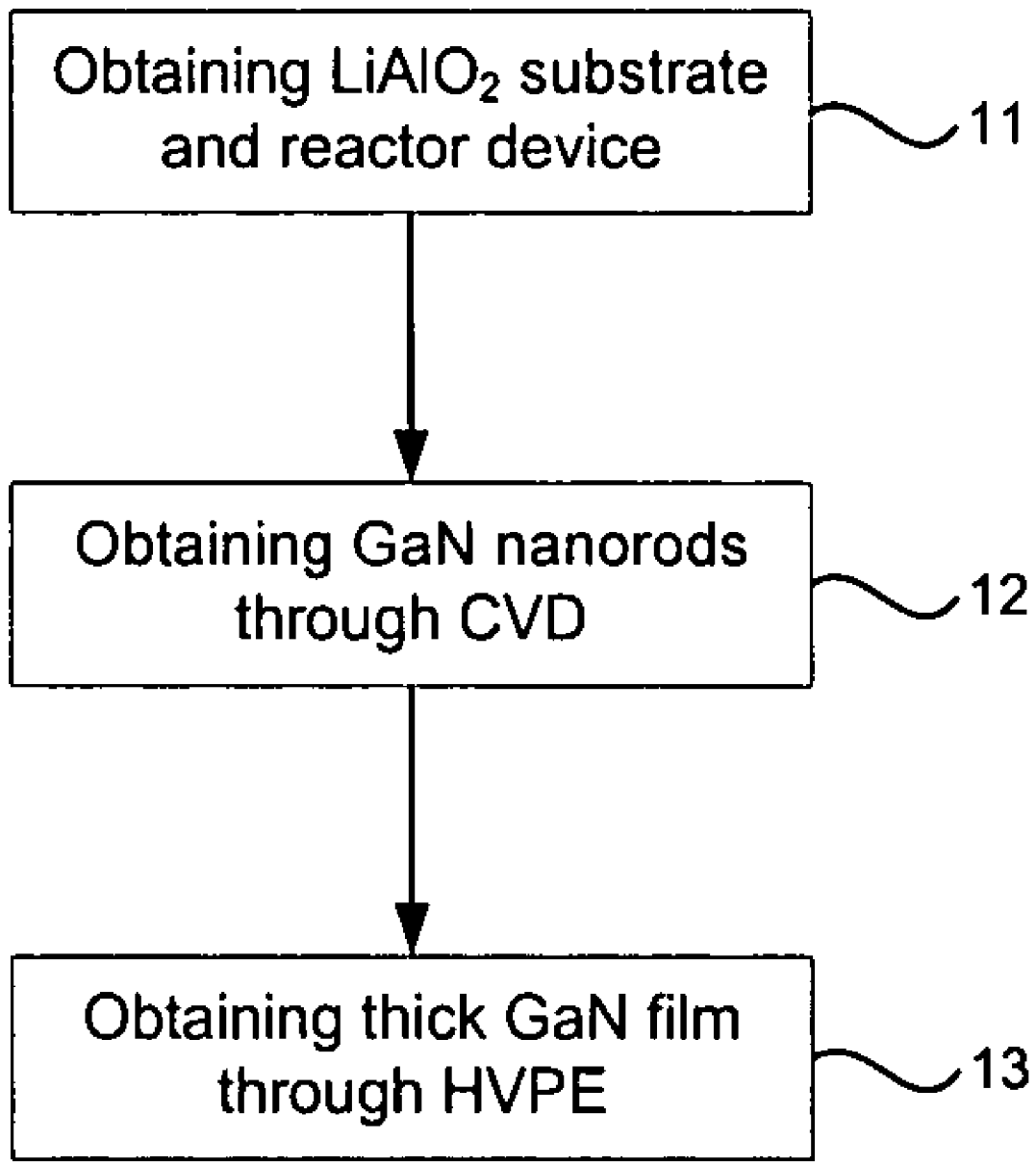
Figure 2:
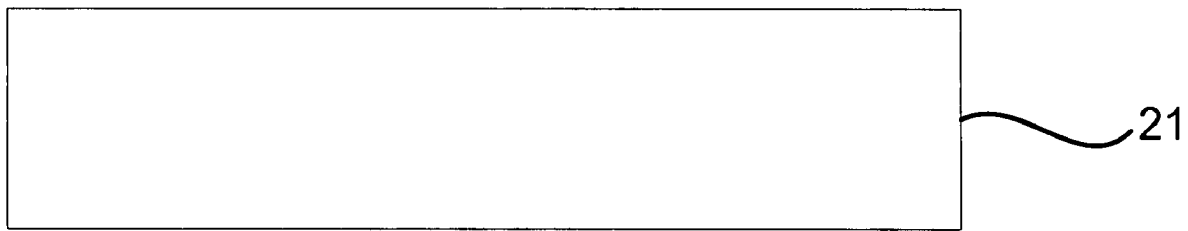
FIG. 2 is the view showing the $LiAlO_2$ substrate.

Please refer to FIG. 1 to FIG. 4, which are a flow view showing a preferred embodiment; a view showing a LiAlO2 substrate; a view showing a GaN nanorods; and a view showing a thick GaN film according to the present invention. As shown in the figures, the present invention is a method of growing GaN using CVD and HVPE, comprising the following steps:

(a) Obtaining a $LiAlO_2$ substrate and a reactor device 11: As shown in FIG. 2, a $LiAlO_2$ substrate 21 and a reactor device (not shown in the figures) are obtained. The substrate made of $LiAlO_2$ can be further a substrate made of sapphire ($Al_2O_3$), lithium gallium oxide ($LiGaO_2$), lithium silicon oxide ($Li_2SiO_3$), lithium germanium oxide ($LiGeO_3$), sodium aluminum oxide ($NaAlO_2$), sodium germanium oxide ($Na_2GeO_3$), sodium silicon oxide ($Na_2SiO_3$), lithium phosphor oxide ($Li_3PO_4$), lithium arsenic oxide ($Li_3AsO_4$), lithium vanadium oxide ($Li_3VO_4$), lithium magnesium germanium oxide ($Li_2MgGeO_4$), lithium zinc germanium oxide ($Li_2ZnGeO_4$), lithium cadmium germanium oxide ($Li_2CdGeO_4$), lithium magnesium silicon oxide ($Li_2MgSiO_4$), lithium zinc silicon oxide ($Li_2ZnSiO_4$), lithium cadmium silicon oxide ($Li_2CdSiO_4$), sodium magnesium germanium oxide ($Na_2MgGeO_4$), sodium zinc germanium oxide ($Na_2ZnGeO_4$) or sodium zinc silicon oxide ($Na_2ZnSiO_4$). The reactor device is a two-stage reactor device serially processing a CVD and an HVPE.

Figure 3:
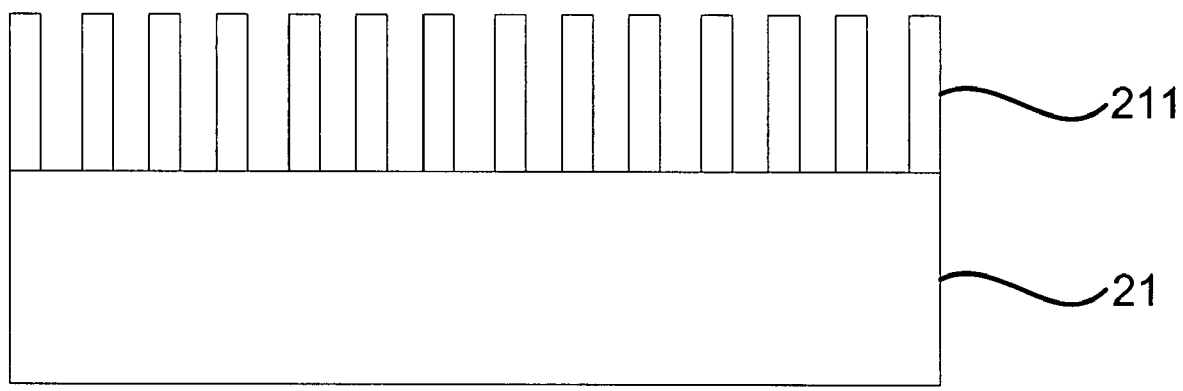
FIG. 3 is the view showing the GaN nanorods.

(b) Obtaining GaN nanorods through CVD 12: As shown in FIG. 3, the $LiAlO_2$ substrate 21 deposed on a seat (not shown in the figure) is sent into the reactor device to be processed with the CVD. Under a high temperature, an ammonia ($NH_3$) gas and a gallium (Ga) metal are obtained as sources for nitrogen (N) element and Ga element. A $N_2$ gas is flowed as a carrying gas. The Ga metal is deposed in a movable boat. Then the $NH_3$ gas is directed in a quartz tube (not shown in the figures) to pass through a mass flow controller (not shown in the figures) for processing the CVD with a chemical reaction to obtain a GaN nanostructure of nanorods 211.

Figure 4:
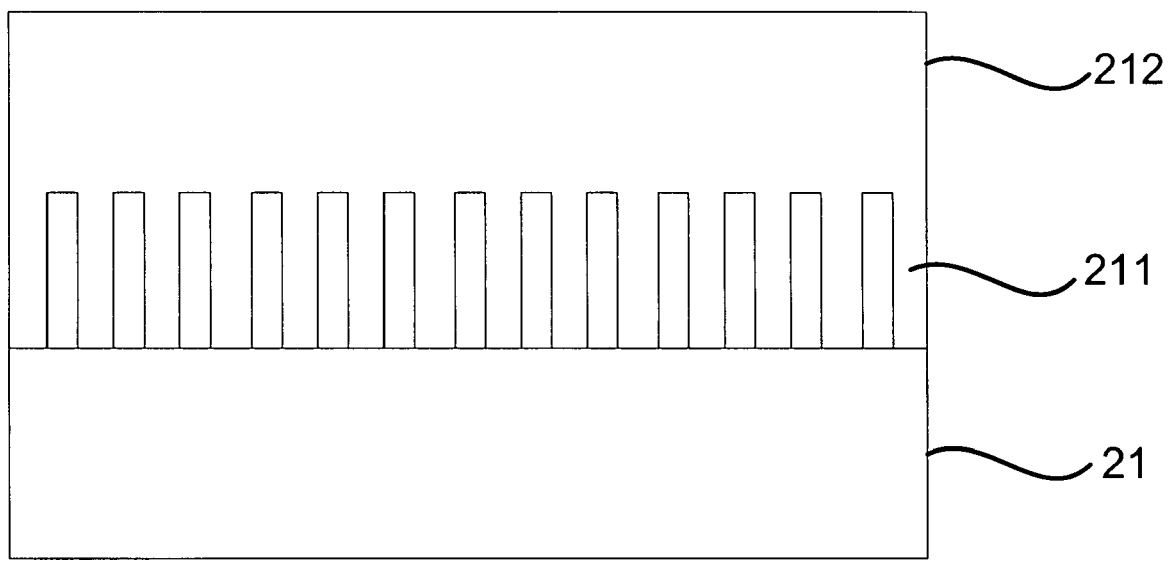
FIG. 4 is the view showing the thick GaN film

(c) Obtaining a thick GaN film through HVPE 13: As shown in FIG. 4, the $LiAlO_2$ substrate 21 having the GaN nanorods 211 is processed with the HVPE in the two-stage reactor device. A nitrogen gas is used as a diluent gas. The Ga metal and a HCl flowed into the two-stage reactor device are reacted under a temperature between 750 and 800 Celsius degrees (° C.) to obtain gallium chloride (GaCl). Then the GaN nanorods 211 are used as nucleus site where GaCl and $NH_3$ are mixed for reaction under a temperature between 500 and 600° C. to form a thin GaN film 212 on the $LiAlO_2$ substrate 21. Then a temperature and a speed of the gases flowed in are adjusted for growing a thick GaN film. Thus, a novel method of growing GaN using CVD and HVPE is obtained.

On using the present invention, a Ga metal is put in a movable boat with a $LiAlO_2$ substrate 21 on a seat. The $LiAlO_2$ substrate 21 is processed with a CVD under a high temperature in a reactor device to grow GaN nanorods 211. Therein, a linear boron nitride (BN) tube is used to prevent a quartz tube of the reactor device from pollution and to reduce an interfacial free energy between the GaN nanorods 211 and the $LiAlO_2$ substrate 21. Thus, GaN nanorods 211 are obtained through the follow chemical formula:

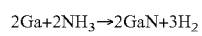

Then the GaN nanorods 211 are used as nucleus sites to process the HVPE in the reactor device to directly grow GaN on the nucleus sites through the following formulas:

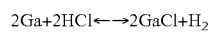

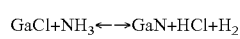

And then the $LiAlO_2$ substrate 21 is transferred to a preheated place to be slowly cooled down in a room temperature.

By adjusting a temperature of the $LiAlO_2$ substrate and by controlling a growing condition through a small temperature difference between the $LiAlO_2$ substrate 21 and its surrounding environment, a thick GaN film is finally obtained. And, owing to a weaker piezoelectric field of the two-stage reactor device, a quantum confined stark effect (QCSE) becomes smaller to effectively mend a problem of spreading lithium element into gaps in GaN while using a $LiAlO_2$ substrate.

To sum up, the present invention is a method of growing GaN using CVD and HVPE, where a CVD is used to grow a GaN nanostructure and then an HVPE is used to grow a thick GaN film on the GaN nanostructure as nucleus sites; and a problem of spreading lithium element into gaps in GaN while using a $LiAlO_2$ substrate is effectively mended.

The preferred embodiment herein disclosed is not intended to unnecessarily limit the scope of the invention. Therefore, simple modifications or variations belonging to the equivalent of the scope of the claims and the instructions disclosed herein for a patent are all within the scope of the present invention.

What is claimed is:

1. A method of growing gallium nitride (GaN) using a chemical vapor deposition (CVD) and a hydride vapor phase epitaxy (HVPE), comprising steps of:
   (a) obtaining a substrate made of $LiAlO_2$ and a reactor device;
   (b) deposing said $LiAlO_2$ substrate on a seat, deposing a gallium (Ga) metal in a movable boat, flowing at least a gas into said reactor device, and processing said CVD in said reactor device under a high temperature to deposit a GaN nanostructure on said $LiAlO_2$ substrate; and
   (c) processing said $LiAlO_2$ substrate through said HVPE in said reactor device with said GaN having said nanostructure as nucleus sites to obtain a thick GaN film by adjusting a temperature and a flow speed of said gas.

2. The method according to claim 1, wherein said reactor device is a two-stage reactor device serially processing said CVD and said HVPE.

3. The method according to claim 1, wherein said method has a device comprising:
   a reactor device, said reactor device being a two-stage reactor device serially processing a CVD and an HVPE;
   a substrate, said substrate having a GaN nanostructure grown on said substrate, said GaN nanostructure having a thick GaN film grown on said GaN nanostructure;
   a boat, said boat being movable, said boat being deposed with a Ga metal; and
   a seat, said seat being deposed with said substrate.

4. The method according to claim 1, wherein said substrate is further made of a material selected from a group consisting of sapphire ($Al_2O_3$) lithium gallium oxide ($LiGaO_2$), lithium silicon oxide ($Li_2SiO_3$), lithium germanium oxide ($LiGeO_3$), sodium aluminum oxide ($NaAlO_2$) sodium germanium oxide ($Na_2GeO_3$), sodium silicon oxide ($Na_2SiO_3$), lithium phosphor oxide ($Li_3PO_4$), lithium arsenic oxide ($Li_3AsO_4$), lithium vanadium oxide ($Li_3VO_4$), lithium magnesium germanium oxide ($Li_2MgGeO_4$), lithium zinc germanium oxide ($Li_2ZnGeO_4$), lithium cadmium germanium oxide ($Li_2CdGeO_4$), lithium magnesium silicon oxide ($Li_2MgSiO_4$), lithium zinc silicon oxide ($Li_2ZnSiO_4$), lithium cadmium silicon oxide ($Li_2CdSiO_4$), sodium magnesium germanium oxide ($Na_2MgGeO_4$), sodium zinc germanium oxide ($Na_2ZnGeO_4$) and sodium zinc silicon oxide ($Na_2ZnSiO_4$).

5. The method according to claim 1, wherein said GaN nanostructure is a GaN nanorods.

* * * * *